United States Patent
Saijo et al.

(10) Patent No.: US 7,175,919 B2
(45) Date of Patent: Feb. 13, 2007

(54) MULTILAYERED METAL LAMINATE AND PROCESS FOR PRODUCING THE SAME

(75) Inventors: Kinji Saijo, Yamaguchi-ken (JP); Kazuo Yoshida, Yamaguchi-ken (JP); Hiroaki Okamoto, Yamaguchi-ken (JP); Shinji Ohsawa, Yamaguchi-ken (JP)

(73) Assignee: Toyo Kohan Co., Ltd., Tokyo (JP)

( * ) Notice: Subject to any disclaimer, the term of this patent is extended or adjusted under 35 U.S.C. 154(b) by 187 days.

(21) Appl. No.: 10/399,530

(22) PCT Filed: Oct. 4, 2001

(86) PCT No.: PCT/JP01/08756

§ 371 (c)(1),
(2), (4) Date: Sep. 29, 2003

(87) PCT Pub. No.: WO02/32660

PCT Pub. Date: Apr. 25, 2002

(65) Prior Publication Data

US 2004/0065717 A1    Apr. 8, 2004

(30) Foreign Application Priority Data

Oct. 18, 2000  (JP) ............................. 2000-318626

(51) Int. Cl.
*B32B 15/01* (2006.01)
(52) U.S. Cl. .................... 428/607; 428/673; 428/685
(58) Field of Classification Search ............... 428/607, 428/675, 685, 652, 679, 673
See application file for complete search history.

(56) References Cited

U.S. PATENT DOCUMENTS

| | | | | |
|---|---|---|---|---|
| 2,484,118 A | * | 10/1949 | Reynolds | 228/208 |
| 3,251,128 A | * | 5/1966 | Ohno | 228/208 |
| 3,970,237 A | * | 7/1976 | Dockus | 228/208 |
| 4,194,672 A |   | 3/1980 | Uto et al. | |
| 4,705,207 A | * | 11/1987 | Norris | 228/194 |
| 6,419,149 B1 | * | 7/2002 | Yano et al. | 228/235.1 |

(Continued)

FOREIGN PATENT DOCUMENTS

EP    1111975 A1  *  6/2001

(Continued)

*Primary Examiner*—John J. Zimmerman
(74) *Attorney, Agent, or Firm*—Browdy and Neimark, PLLC

(57) ABSTRACT

An adhesive-free multilayered metal laminate having a given thickness which is obtained by bonding a metal sheet having a thin metal film on a surface thereof to a metal foil without using an adhesive; and a process for continuously producing the laminate. The process comprises the steps of; setting a metal sheet on a reel for metal sheet unwinding; setting a metal foil on a reel for metal foil unwinding; unwinding the metal sheet from the metal sheet-unwinding reel and activating a surface of the metal sheet to thereby form a first thin metal film on the metal sheet surface; unwinding the metal foil from the metal foil-unwinding reel and activating a surface of the metal foil to thereby form a second thin metal film on the metal foil surface; and press-bonding the activated surface of the first thin metal film to that of the second thin metal film so that the first thin metal film formed on the metal sheet is in contact with the second thin metal film formed on the metal foil.

2 Claims, 4 Drawing Sheets

U.S. PATENT DOCUMENTS

| | | | |
|---|---|---|---|
| 6,579,565 B2 * | 6/2003 | Saijo et al. | 430/312 |
| 6,663,980 B1 * | 12/2003 | Saijo et al. | 428/607 |
| 6,730,391 B1 * | 5/2004 | Saijo et al. | 428/209 |
| 6,838,318 B1 * | 1/2005 | Saijo et al. | 438/121 |
| 2002/0166840 A1 * | 11/2002 | Saijo et al. | 216/41 |
| 2003/0186484 A1 * | 10/2003 | Saijo et al. | 438/106 |

FOREIGN PATENT DOCUMENTS

| | | | |
|---|---|---|---|
| EP | 1119048 A1 * | 7/2001 | |
| JP | 54-039341 | 3/1979 | |
| JP | 61-009985 | 1/1986 | |
| JP | 01-127184 | 5/1989 | |
| JP | 04-041681 | 2/1992 | |
| JP | 04-091872 | 3/1992 | |
| JP | 10-296080 | * 11/1998 | |
| WO | WO 00/05934 | * 2/2000 | |
| WO | WO 00/19533 | * 4/2000 | |

\* cited by examiner

MULTILAYERED METAL LAMINATE AND PROCESS FOR PRODUCING THE SAME

TECHNICAL FIELD

The present invention relates to a multilayered metal laminate which is obtained by laminating a metal sheet with a metal foil by a method not using an adhesive, and a process for producing the same.

BACKGROUND ART

A large number of metal sheet laminates obtained by laminating metal sheets have been so far proposed. Ordinary metal sheet laminates have been mainly used in a structural material.

In recent years, the use of the metal sheet laminate has been diversified, and it has been required to supply a special material used for forming a fine shape through etching.

In an etching material, an alternate laminate of an etching layer and an etching stop layer, such as a laminate of etching layer/etching stop layer/etching layer, is needed to form a fine shape through etching.

The formation of such an etching stop layer has been so far performed by a wet plating technique or a clad technique in which heat diffusion treatment is conducted after hot or cold rolling.

Nevertheless, such a technique is problematic in that it involves an intricate process and is not appropriate for a fine metal sheet laminate requiring precision.

The first problem of the invention is to provide a multilayered metal laminate which has a given thickness and is adhesive-free and which is obtained by bonding a metal sheet having a thin metal film previously formed on the surface by a thin film forming method such as vacuum deposition or sputtering to a metal foil having a given thickness without using an adhesive.

Further, the second problem of the invention is to provide a process in which production of a multilayered metal laminate including formation of a thin film on a metal sheet and bonding to a metal foil is continuously performed.

DISCLOSURE OF THE INVENTION

A multilayered metal laminate of the invention is characterized in that a surface of a first thin metal film formed on a surface of a metal sheet is laminate in contact with a surface of a second thin metal film formed on a surface of a metal foil.

In one embodiment of such a multilayered metal laminate, it is preferable that the metal sheet is a copper sheet, the first thin metal film is nickel, the metal foil is a copper foil and the second thin metal film is nickel.

In another embodiment of such a multilayered metal laminate, it is preferable that the metal sheet is a stainless steel sheet, the first thin metal film is silver and the metal foil is stainless steel.

In a third embodiment of such a multilayered metal laminate, it is preferable that the metal sheet is a copper sheet, the first thin metal film is aluminum and the metal foil is a copper foil.

In yet another embodiment of such a multilayered metal laminate, it is preferable that the metal sheet is a stainless steel sheet, the first thin metal film is silver and the metal foil is stainless steel.

A process for producing a multilayered metal laminate in the invention is characterized by comprising a step of setting a metal sheet on a reel for metal sheet unwinding, a step of setting a metal foil on a reel for metal foil unwinding, a step of unwinding the metal sheet from the metal sheet-unwinding reel and activating a surface of the metal sheet to form a first thin metal film on the metal sheet surface, a step of unwinding the metal foil from the metal foil-unwinding reel and activating a surface of the metal foil to form a second thin metal film on the metal sheet surface, and a step of press-bonding the activated surface of the first thin metal film to that of the second thin metal film.

A process for producing a multilayered metal laminate in the invention is characterized by comprising a step of setting a metal sheet on a reel for metal sheet unwinding, a step of setting a metal foil on a reel for metal foil unwinding, a step of unwinding the metal sheet from the metal sheet-unwinding reel and activating a surface of the metal sheet to form a first thin metal film on the metal sheet surface, a step of unwinding the metal foil from the metal foil-unwinding reel and activating a surface of the metal foil, and a step of press-bonding the activated surface of the first thin metal film to that of the metal foil.

BEST MODE FOR CARRYING OUT THE INVENTION

Figure 1:
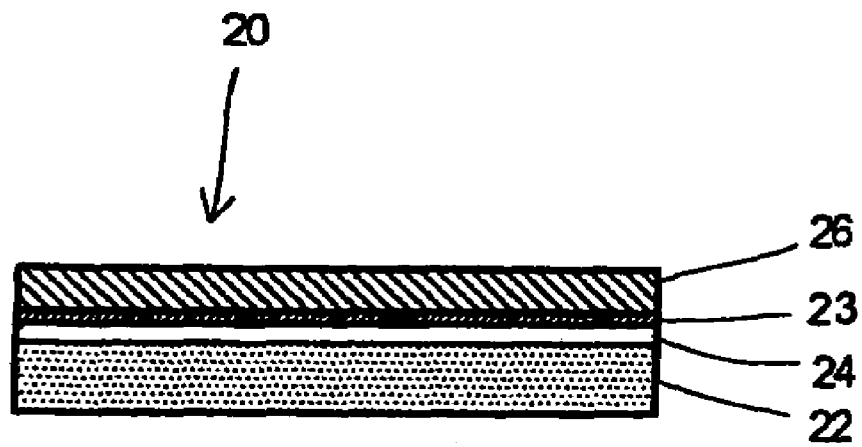
FIG. 1 is a sectional view of a multilayered metal laminate.
Figure 2:
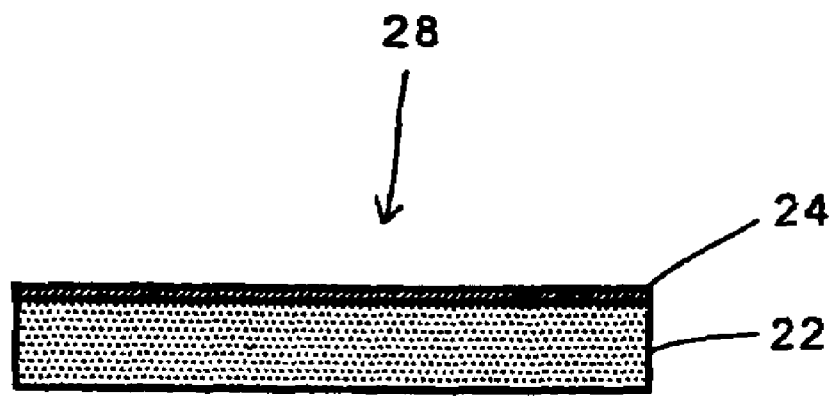
FIG. 2 is a sectional view of a thin metal film laminate.

FIG. 1 is a schematic view showing a sectional structure of the multilayered metal laminate in the invention.

In FIG. 1, a metal sheet 22 is laminated on a metal foil 26 through a first thin metal film 24. With respect to a material of the metal sheet 22, its type is not particularly limited so long as it is a material capable of forming a thin film on a metal sheet. It is selectively used, as required, according to the use of the multilayered metal laminate in the invention.

For example, when the multilayered metal laminate of the invention is used in a mounting printed board, a copper sheet, a titanium sheet, a stainless steel sheet, an aluminum sheet and the like are preferably employed as the material of the metal sheet.

The thickness of the metal sheet 22 varies with the use. When it is used in a mounting printed board, a range of from 10 to 200 µm is preferably used. A range of from 25 to 150 µm is more preferably used.

With respect to a material of the first or second thin metal film 23 or 24, its type is not particularly limited so long as it is a material having a good adhesion to the metal sheet as a base.

For example, when the metal sheet 22 is a copper sheet or a stainless steel sheet, Fe, Ni, Cr, Pd, Zr, Co, Au, Ag, Sn, Cu, Al and the like are preferably used as the first or second thin metal film 23 or 24. A thin metal film comprising plural layers of these metals is also available. Further, an alloy of these metals is also available as the thin film.

The thickness varies with the use. When it is used in a mounting printed board, a range of from 0.01 to 1 µm is preferably used. A range of from 0.1 to 0.5 µm is more preferably used.

As a material of the metal foil 26, for example, a single-layer foil such as a copper foil, a nickel foil, an aluminum foil or an iron foil, a laminated foil (clad material) thereof, an alloy foil thereof, a rolled sheet thereof and the like can be used. Further, it is possible to use plated foils obtained by plating the surfaces thereof. The thickness varies with the use. When it is used in, for example, amounting printed board, a range of from 3 to 100 μm is preferably used. A range of from 10 to 35 μm is more preferably used.

When the multilayered metal laminate of the invention is used in a radiation plate, a range of from 50 to 1,000 μm by which it is somewhat thicker is preferably used for improving heat conduction.

The process for producing the multilayered metal laminate in the invention is described below.

Figure 3:
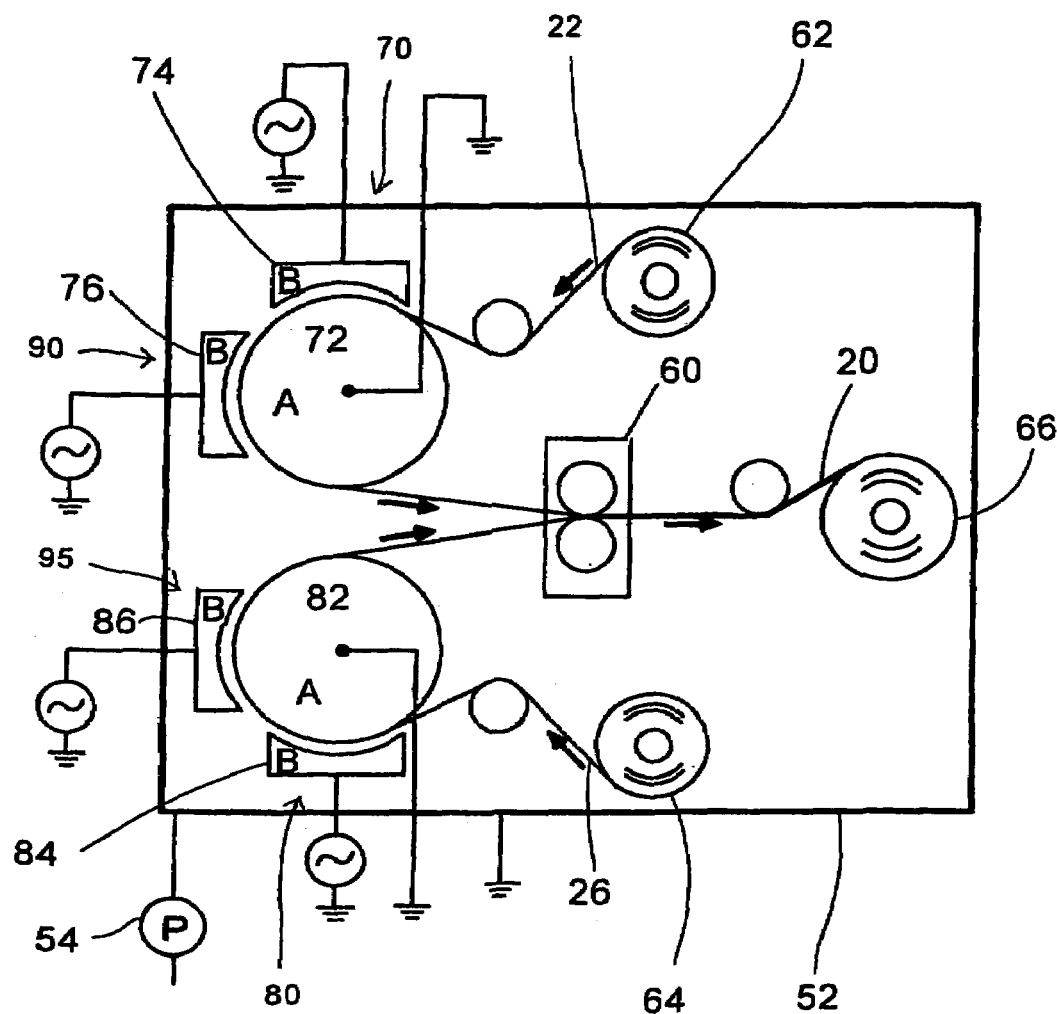
FIG. 3 is a schematic view showing a production process.

In the first production process, as shown in FIG. 3, the metal sheet 22 is set on an unwinding reel 62, and the surface of the metal sheet 22 is activated using an activation device 70 mounted in an apparatus 50 for producing a multilayered metal laminate.

The activation here referred to indicates surface treatment for removing foreign matters adhered to the surface of the thin metal film on the metal sheet, such as metal oxides, dust-adhered matters and oil to improve an adhesion to the metal foil in the subsequent step. Likewise, the surface of the metal foil 26 is also activated using an activation device 80.

With respect to the activation devices 70, 80, a device having a mechanism capable of cleaning a surface can preferably be employed. In Examples of the invention, a device that conducts sputter-etching of respective bonding surfaces of materials to be press-bonded is employed.

That is, as shown in FIG. 3, the method of activation by sputter-etching is performed, as previously disclosed by the present Applicant in JP-A-1-224184, by (4) conducting sputter-etching of the metal sheet 22 and the metal foil 26 (1) in an inert gas atmosphere under a very low pressure of from $1 \times 10^{1} \times 10^{-3}$ Pa such that (2) an alternating current with from 1 to 50 MHz is applied between one (72) of electrodes A earthed respectively and another insulated and supported electrode B (74) to allow glow discharge and (3) an area a of an electrode roll 72 or 82 exposed to plasma generated by the glow discharge is less than ⅓ an area b of an electrode 74 or 84. This is preferable because the surface can be activated at high speed. In the foregoing structure, ion impact occurs preferentially on the side of the electrode A for a material to be etched, and little occurs on the side of the electrode B.

Incidentally, the surface activation can also be performed using an ion gun or the like in which the surface activation is performed at high speed.

A method in which the first thin metal film 24 is formed on the surface of the metal sheet 22 and the second thin metal film 23 is formed on the surface of the metal foil 26 is described below.

For this purpose, a thin film forming unit 90 for forming the first thin metal film 24 on the metal sheet 22 is mounted in the later step of the activation device 70 within a vacuum container 52.

That is, as shown in FIG. 3, the alternating current with from 1 to 50 MHz is applied between the one earthed electrode A (electrode roll 72) and the other insulated and supported electrode B (76) to allow the glow discharge.

In this case, an area a of the electrode roll 72 exposed to plasma generated by the glow discharge is adapted to be at least three times an area b of the electrode 76, whereby the first thin metal film 24 is formed on the surface of the metal sheet 22 without etching the surface of the metal sheet 22.

That is, in a sputter unit for conducting formation of a thin film, an area ratio of opposite electrodes a and b is the inverse of that in the activation, whereby ion impact can be applied to the target side to form a thin film on a metal sheet.

Figure 4:
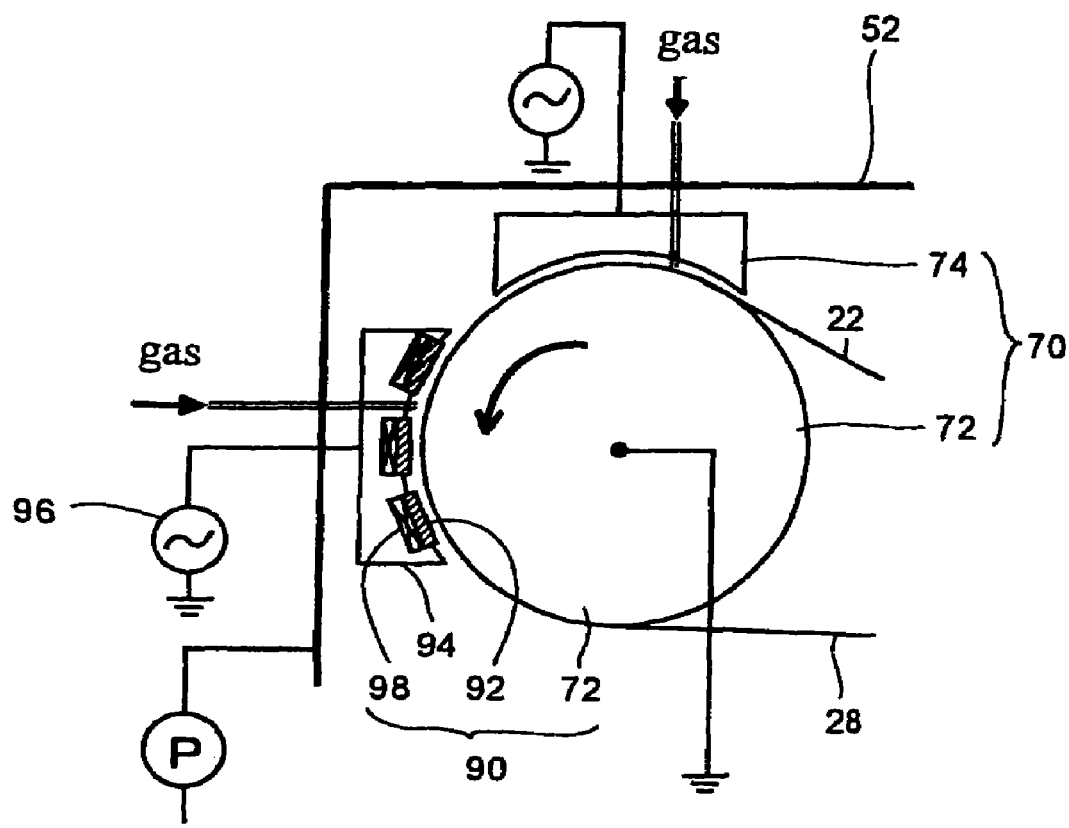
FIG. 4 is a schematic view showing a production process.

A sputter unit employed as an example of the thin film forming unit 90 used in the invention is described by referring to FIG. 4.

The sputter unit 90 comprises a combination of a target electrode 94 caused to electrically float and the water-cooled grounded electrode roll 72. A target 92 for forming the first thin metal film 24 is put on the target electrode 94, and a magnet 98 is also put thereon to improve a sputtering efficiency by a magnetic field. Further, for preventing the target 92 from being abnormally heated, the target electrode 94 is adapted to be water-cooled.

In performing the sputtering, the pressure is maintained at $1 \times 10^{-3}$ Pa or less, and an inert gas such as argon, neon, xenon or krypton and a gas such as oxygen are then introduced into the vacuum container 52 to provide a gaseous atmosphere of from $1 \times 10^{1}$ to $1 \times 10^{-3}$ Pa.

Then, a high-frequency power supply 96 is loaded on the target electrode 94 to generate plasma between the target electrode 94 and the electrode roll 72, whereby ion impact is applied to the target 92.

Target atoms are thereby released to form the first thin metal film 24 on the metal sheet 22.

Likewise, the metal foil 26 to be laminated is also activated using the activation device 80, and the second thin metal film 23 is formed on the surface of the metal foil 26 using a thin metal film forming unit 95 which is the same as the thin film forming unit 90.

Figure 5:
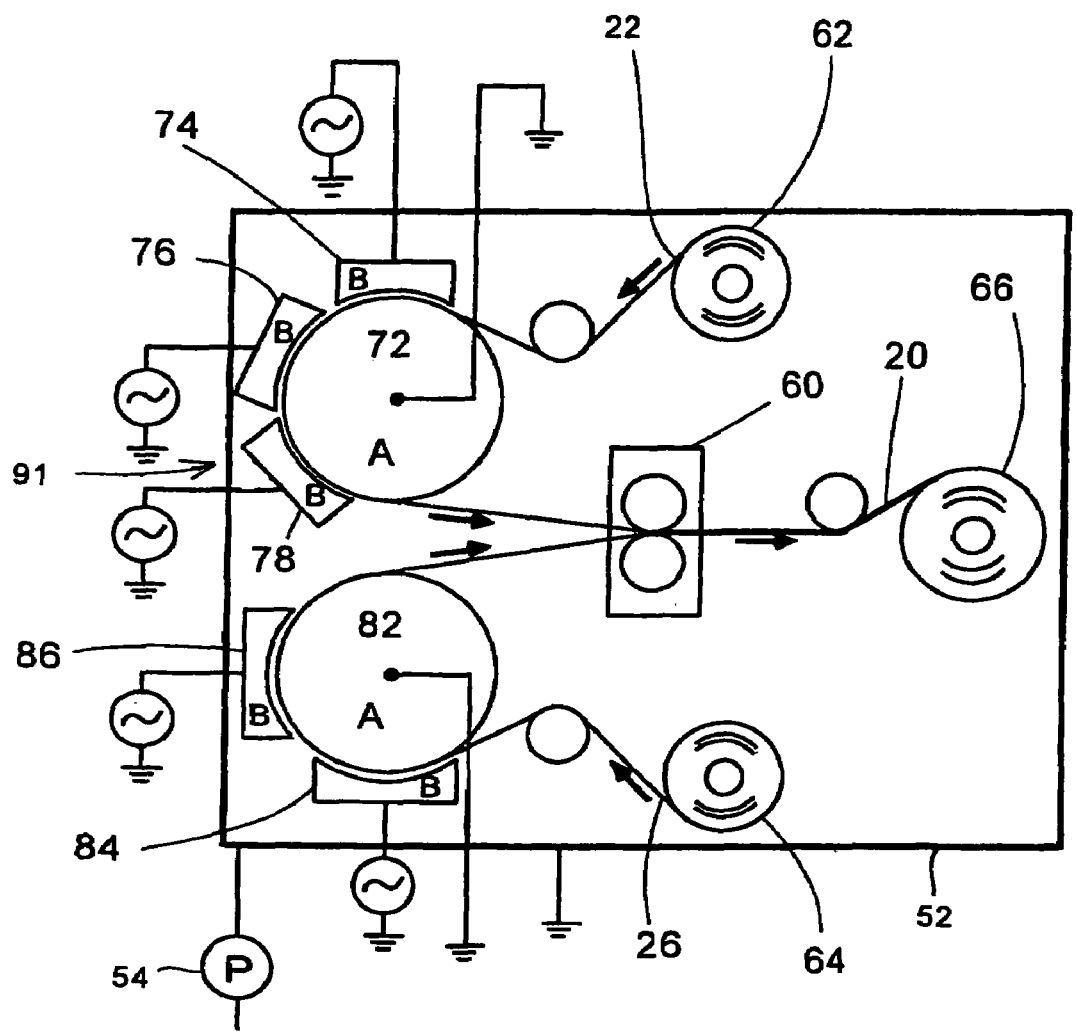
FIG. 5 is a schematic view showing a production process of the invention.

Further, as shown in FIG. 5, the second thin metal film 23 can be multilayered by installing plural electrodes 76 and arranging plural thin film forming units 91. Such thin metal films may be the same types or the different types. Still further, even when the plural electrodes 76 are installed, no metal thin film can be formed at all by switching off power supplies of the electrodes. Furthermore, plural layers of thin films can also be formed by switching off some power supplies.

As a method for forming the first and second thin metal films, a known method such as a sputtering method, an ion plating method or a vacuum deposition method (refer to JP-A-8-231717) can be used.

Moreover, when the surface of the metal sheet 22 or the metal foil 26 is roughened, the adhesion strength with the thin metal film is preferably improved.

Then, the activated surfaces are superposed, and bonded by press-bonding with a press-bonding unit 60, whereby the multilayered metal laminate 20 is produced within the same vacuum container in one process.

The press-bonding is preferably light press-bonding so as to prevent damage of the metal foil or the thin metal film. When it is numerically expressed in terms of, for example, a draft, a range of from 0.1 to 10% is preferable.

EXAMPLES

Examples are described below by referring to the drawings.

Example 1

A copper sheet having a thickness of 100 μm was used as a metal sheet. Further, a copper foil having a thickness of 18 μm was used as a metal foil.

(1) Activation

The copper sheet 22 unwound from the metal sheet-unwinding reel 62 and the copper foil 26 unwound from the metal foil-unwinding reel 64 were wound respectively on the water-cooled electrode rolls 72, 82 in the vacuum container 52, and activated in the activation unit 70 by a sputter-etching method.

(2) Formation of a Thin Metal Film

After the copper sheet 22 was activated, it was sent to the sputter unit 90 while being wound on the water-cooled electrode roll 72 to form a thin nickel film having a thickness of 0.2 μm as the thin metal film 24.

Further, after the copper foil 26 was activated, it was sent to the sputter unit 95 while being wound on the water-cooled electrode roll 82 to form a thin nickel film having a thickness of 0.2 μm as the thin metal film 23.

(3) Press-Bonding

The bonding surfaces of the copper sheet 22 having the metal thin film 24 of nickel formed on the surface and the copper foil 26 having the thin metal film 23 of nickel formed on the surface were superposed, and subjected to cold-press-bonding with a low draft of 0.5% to produce a multilayered metal laminate comprising four layers of the copper sheet, the thin nickel film, the thin nickel film and the copper foil.

Example 2

A copper sheet having a thickness of 100 μm was used as a metal sheet. Further, a copper foil having a thickness of 35 μm was used as a metal foil.

(1) Activation

The copper sheet 22 unwound from the metal sheet-unwinding reel 62 and the copper foil 26 unwound from the metal foil-unwinding reel 64 were wound respectively on the water-cooled electrode rolls 72, 82 in the vacuum container 52, and activated in the activation unit 70 by a sputter-etching method.

(2) Formation of a Thin Metal Film

After the copper sheet 22 was activated, it was sent to the sputter unit 90 while being wound on the water-cooled electrode roll 72 to form a thin aluminum film having a thickness of 0.5 Am as the thin metal film 24.

Further, after the copper foil 26 was activated, it was passed through the sputter unit 95 while being wound on the water-cooled electrode roll 82. However, a power supply was switched off, and a thin metal film was not formed.

(3) Press-Bonding

The bonding surfaces of the copper sheet 22 having the thin aluminum film as the metal thin film 24 formed on the surface and the copper foil 26 subjected to the surface activation were superposed, and subjected to cold-press-bonding with a low draft of 0.5% to produce a multilayered metal laminate comprising three layers of the copper sheet, the thin aluminum film and the copper foil.

INDUSTRIAL APPLICABILITY

Since the multilayered metal laminate of the invention is one obtained by press-bonding within the vacuum container without using an adhesive, the metal foil and the metal sheet can be produced with a uniform thickness.

Further, since the surface activation, the formation of the thin metal film and the press-bonding are performed in one process, the multilayered metal laminate can easily be obtained. Moreover, since the surface activation and the formation of the thin metal film are conducted on the same electrode rolls, the apparatus can be rendered compact.

The invention claimed is:

1. A multilayered metal laminate to which a surface of a first thin metal film formed on a surface of a metal sheet is laminated in continuous contact with a surface of a metal foil;

wherein the metal sheet is a stainless steel sheet, the first thin metal film is silver, and the metal foil is stainless steel.

2. The multilayered metal laminate according to claim 1, wherein said thins metal film is press-bonded to the metal foil.

* * * * *